United States Patent [19]

Campbell, III et al.

[11] Patent Number: 4,688,096
[45] Date of Patent: Aug. 18, 1987

[54] DEMODULATION PHASE ERROR COMPENSATION CIRCUITRY AS FOR AN AUTOMATIC DEGHOSTING SYSTEM

[75] Inventors: Edward R. Campbell, III, Tabernacle; Henry G. Lewis, Jr., Hamilton Square, both of N.J.

[73] Assignee: RCA Corporation, Princeton, N.J.

[21] Appl. No.: 878,260

[22] Filed: Jun. 25, 1986

[51] Int. Cl.$^4$ .............................................. H04N 5/21
[52] U.S. Cl. ..................................... 358/167; 358/36; 358/905; 455/295
[58] Field of Search .................... 358/167, 905, 35, 36, 358/37, 160, 188; 455/276, 278, 295, 304

[56] References Cited

U.S. PATENT DOCUMENTS

| | | | |
|---|---|---|---|
| 4,047,224 | 9/1977 | Yamaguti | 358/166 |
| 4,285,006 | 8/1981 | Kurahashi et al. | 358/35 |
| 4,374,400 | 2/1983 | Holmes | 358/167 |
| 4,497,067 | 1/1985 | Namiki | 455/278 |
| 4,584,652 | 4/1986 | Sturza et al. | 364/484 |

FOREIGN PATENT DOCUMENTS 2042307  9/1980  United Kingdom ................ 455/278

OTHER PUBLICATIONS

Thedick, H., "Adaptive Multipath Equalization for TV Broadcasting", IEEE Trans. on Consumer Electronics, May 1977, pp. 175-181.

Primary Examiner—Tommy P. Chin
Attorney, Agent, or Firm—E. M. Whitacre; P. J. Rasmussen; K. N. Nigon

[57] ABSTRACT

A television receiver which includes an automatic deghosting system synchronously demodulates IF television signals to generate baseband signals representing the in-phase and quadrature phase modulation components of the IF signals. A signal representing the phase difference between the carrier of the signal as broadcast and the carrier of the received signal, which may include ghosts, is generated from the in-phase and quadrature signals. This signal is applied to circuitry which develops signals proportional to the sine and cosine of the phase angle separating the broadcast carrier phase and the received carrier phase. The demodulated in-phase and quadrature phase baseband signals are multiplied by the sine and cosine signals in a complex multiplier to correct distortion resulting from the synchronous demodulation using the carrier of the received signal.

6 Claims, 8 Drawing Figures

DEMODULATION PHASE ERROR DETECTOR

COMPLEX MULTIPLIER

DEMODULATION PHASE ERROR COMPENSATION CIRCUITRY AS FOR AN AUTOMATIC DEGHOSTING SYSTEM

The present invention relates to circuitry which compensates for demodulation phase errors in synchronously demodulated television signals which may include multipath distortion components.

Television reception has long been plagued by multipath distortion, the reception of undesired multiple signals. These undesired signals, reflected from buildings and other large objects or resulting from poorly terminated cable networks, appear as delayed versions of the direct television signal and are commonly referred to as ghost signals.

The ghost signals are delayed from the direct signal as a function of the relationship of the signal path lengths between the direct and ghost signals. The randomness of this relationship from one receiver location to another dictates that the phase of the ghost carrier signal may have any relationship to the phase of the direct carrier signal.

Ghost canceling systems have been developed for inclusion in television receivers to limit the undesirable effects of multipath distortion in the reproduced image. In many of these ghost canceling systems, the incoming television signals are synchronously demodulated in phase with the picture carrier signal. Exemplary systems of this type are described in the article entitled "Adaptive Multipath Equalization For T.V. Broadcasting", IEEE Transactions on Consumer Electronics, May 1977, pp. 175-181 by H. Thedick; U.S. Pat. No. 4,285,006 entitled "Ghost Cancellation Circuit System"; and U.S. Pat. No. 4,374,400 entitled "Television Ghost Cancellation System With Ghost Carrier Phase Compensation", which are hereby incorporated by reference.

One of these systems, described in the Thedick reference, synchronously demodulates signals provided by the intermediate frequency (IF) amplifier of a television receiver to develop two baseband signals, I and Q, representing, respectively, the in-phase and quadrature phase modulation components of the IF signals. The I and Q signals are used by the system to cancel, respectively, the in-phase and quadrature phase ghost signal components of the synchronously demodulated I signal.

When the incoming television signal includes a relatively strong ghost signal component having a carrier phase that differs significantly from the carrier phase of the direct signal, the direct signal components of the I and Q signals may be distorted. This distortion occurs because the IF carrier signal, which is the vector sum of the direct and ghost carrier signals, has a different phase than the direct carrier signal. When this IF carrier signal is used to synchronously demodulate the IF signals, quadrature modulation components of the direct signal may appear in the demodulated I signal and in-phase components of the direct signal may appear in the demodulated Q signal. The amount of crosstalk between the in-phase and quadrature phase modulation components of the direct signal depends on the relative signal strength of the direct and ghost signals and on the difference in phase between the received and direct carrier signals. Crosstalk of the quadrature modulation component of the direct signal into the synchronously demodulated I signal may distort the reproduced image. This distortion appears as excessive peaking of vertical edges or as an apparent loss of horizontal resolution depending on whether the quadrature component of the direct signal tends to reinforce or cancel the respective in-phase component.

SUMMARY OF THE INVENTION

The present invention is circuitry for use in a ghost cancellation system to substantially reduce any distortion resulting from crosstalk between the in-phase and quadrature phase modulation components of the direct signal which may occur in the presence of a strong ghost signal. The circuitry includes a demodulation phase error detector that is responsive to synchronously demodulated I and Q signals, corresponding to baseband in-phase and quadrature phase modulation components of IF television signals, to develop a signal proportional to the phase difference between the direct carrier signal and the IF carrier signal. This phase difference signal is applied to circuitry which develops a phase correction signal. The phase correction signal is combined with the synchronously demodulated I signal to produce a modified I signal having substantially reduced crosstalk distortion from the quadrature modulation components of the direct signal.

DETAILED DESCRIPTION

Figure 1:
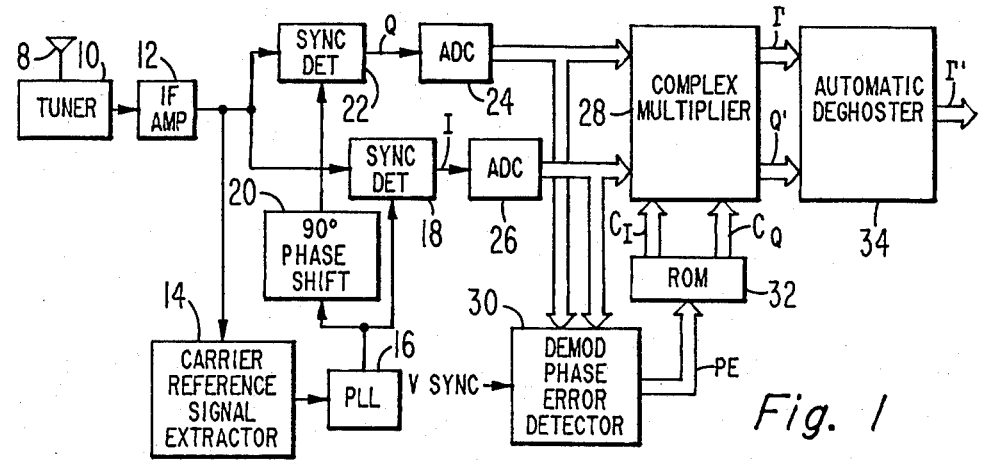
FIG. 1 is a block diagram of a portion of a television receiver including an embodiment of the present invention.

In the drawings, broad arrows represent busses for multiple-bit parallel digital signals and line arrows represent connections carrying analog signals or single bit digital signals. Depending on the processing speed of the devices, compensating delays may be required in certain of the signal paths. One skilled in the art of digital signal processing circuit design would know where such delays would be needed in a particular system.

Referring to FIG. 1, RF signals are received by an antenna 8 and applied to tuner circuitry 10. The tuner circuitry 10, which may be of conventional design, heterodynes the RF signals with a signal developed by a local oscillator (not shown) to develop IF signals which include composite video signals modulating an IF carrier. These IF signals are amplified by an IF amplifier 12 and applied to carrier reference signal extracting circuitry 14. The circuitry 14 may, for example, be a conventional band-pass filter having a narrow bandwidth frequency response characteristic centered about the IF carrier frequency. The signal provided by the circuitry 14 is the IF carrier signal to the relative exclusion of any modulation components. This carrier signal is applied to a phase locked loop (PLL) 16 which may be of conventional design. The PLL 16 generates a relatively stable oscillatory signal that is locked in frequency and phase to the extracted carrier signal. This oscillatory signal is applied to one input terminal of a synchronous detector 18 and to the 90° phase shifting circuitry 20. The circuitry 20 develops a signal that is quadrature phase related to the oscillatory signal provided by the PLL 16. This quadrature oscillatory signal is applied to one input terminal of a synchronous detector 22. The signal provided by IF amplifier 12 is applied to a second input terminal of each of the synchronous detectors 18 and 22. The synchronous detectors 18 and 22 may, for example, multiply the IF signal by the respective in-phase and quadrature phase oscillatory signals to generate baseband signals (I and Q) representing, respectively, the in-phase and quadrature phase modulation components of the IF signals. The I and Q signals are digitized by analog to digital converters (ADC's) 26 and 24 respectively. The digitized I and Q signals are applied to a complex multiplier 28 and to a demodulation phase error detector 30. The demodulation phase error detector 30 and a read-only memory (ROM) 32 devolop correction signals $C_I$ and $C_Q$ that are combined with the signals I and Q in the complex multiplier 28 to develop in-phase and quadrature phase signals, I' and Q' which are substantially free of direct signal crosstalk distortion components. The signals I' and Q' are applied to automatic deghosting circuitry 34. The deghosting circuitry 34, which may, for example, be similar to that set forth in the Thedick article or the U.S. Patents referenced above, processes the I' signal to substantially remove multipath distortion components and provides a deghosted signal I'' at its output terminal.

As an aid to understanding the signal correction performed by the demodulation phase error detector 30, ROM 32 and complex multiplier 28, consider the nature of the distortion. As set forth above, ghost signals having carrier phases which differ from the carrier phase of the originally broadcast or direct signal may cause the carrier phase of the incoming signals to be different than that of the direct signal. This difference in phase propagates through the tuner 10 and IF amplifier 12 so that the phase of the carrier signal extracted by the circuitry 14 may not match the phase of the IF carrier of the direct signal. Since the signals developed by the PLL 16 are locked in phase to the extracted carrier signal, the I signal developed by the synchronous detector 18 may include crosstalk components from the quadrature component of the direct signal and the Q signal developed by the synchronous detector 22 may include crosstalk components from the in-phase component of the direct signal.

Figure 4A:
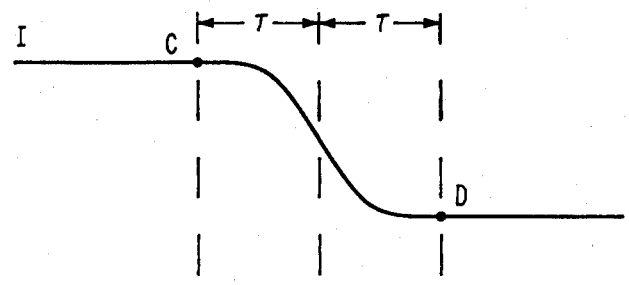
FIGS. 4A-4E are waveform diagrams of amplitude versus time that are useful in explaining the operation of the portion of the television receiver shown in FIG. 1.
Figure 4B:
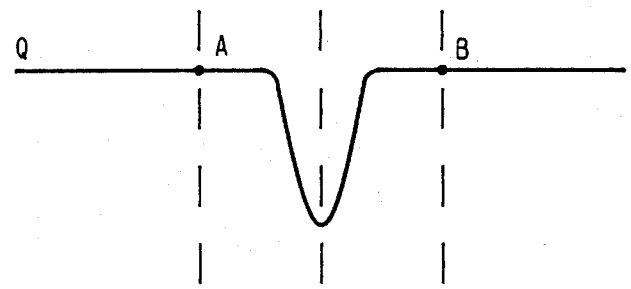

The effects of the this distortion are shown in FIGS. 4A, 4B, 4D and 4E. FIGS. 4A and 4B are waveform diagrams representing, respectively, the in-phase and quadrature phase components of the leading edge of the vertical synchronization pulse (vertical sync) for the direct signal. The leading edge of vertical sync is a training signal commonly used by automatic deghosting systems. As shown in FIG. 4A, the in-phase component of the direct signal is a smooth monotonic transition from a value corresponding to black level to a value corresponding to the sync tip level. The waveform shown in FIG. 4B is the quadrature phase component of the signal, the Hilbert transform of the components of signal shown in FIG. 4A having frequencies greater than 1 MHz.

Figure 4C:
Figure 4D:
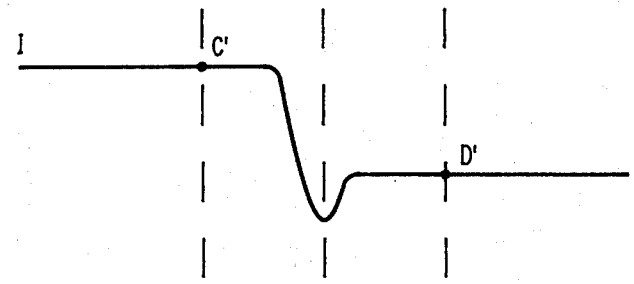
Figure 4E:
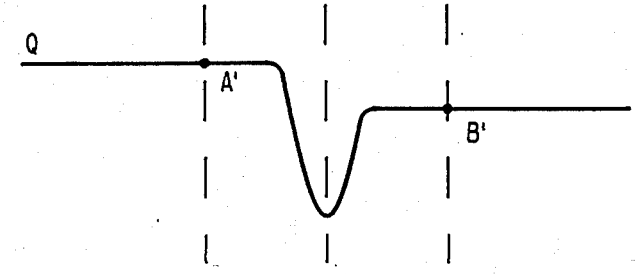

FIGS. 4D and 4E show the effects of demodulation phase errors on the I and Q signals. In FIG. 4D, the I waveform of the direct signal transistion is no longer monotonic, and the Q waveform in FIG. 4E exhibits different levels before and after the leading edge of vertical sync. It is this distortion of the in-phase and quadrature components of the leading edge of the vertical sync pulse that is used by the present embodiment of the invention to detect and correct demodulation phase errors.

None of the waveforms shown in FIGS. 4A–4E include any ghost signal components. In the present embodiment, the ghost signals causing the demodulation phase errors are assumed to be delayed from the direct signal by an amount of time greater than $2\tau$, the amount of time between the points A and B on the waveform 4B.

Referring to FIG. 1, the digitized I and Q signals, provided by the ADC's 26 and 24 respectively, are applied to the input terminals of the demodulation phase error detector 30. A signal, VSYNC, which may, for example, be generated by vertical synchronization signal separating circuitry (not shown) is applied to another input terminal of the demodulation phase error detector 30. A waveform representing the signal VSYNC is shown in FIG. 4C. It may, for example, consist of a single pulse for each field which occurs substantially coincident with the leading edge of the vertical sync component of the demodulated composite video signal.

Figure 2:
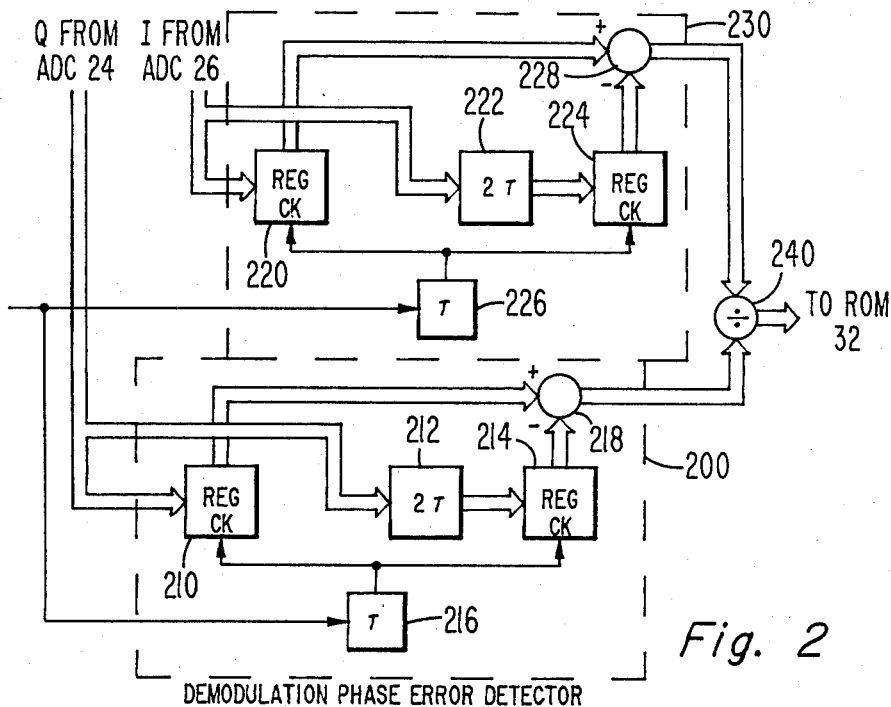
FIG. 2 is a block diagram of a demodulation phase error detector which may be used in the portion of the television receiver shown in FIG. 1.

FIG. 2 is a block diagram of a demodulation phase error detector suitable for use as the detector 30. The detector shown in FIG. 2 includes two sample difference circuits 200 and 230 which develop signals representing the difference between the sample values of the respective Q and I signals taken before and after the leading edge of sync. Since the circuits 200 and 230 are identical, only one, 200, is described in detail.

Digital samples representing the signal Q are applied to the data input port of a register 210. The signal VSYNC, delayed by an amount of time, $\tau$, via the delay element 216 is applied to the clock input terminal of the register 210. The register 210 loads the sample value applied to its data input port coincident with the leading edge of the VSYNC pulse and holds this sample value until the next occurrence of a VSYNC pulse. The sample value held by the register 210 is applied to a first input terminal of a subtracter 218. The digitized Q signal is also applied to a delay element 212 which provides a time delay substantially equal to an amount of time, $2\tau$. The signal provided by the delay element 212 is applied to a register 214, which is clocked by the delayed VSYNC signal provided by the delay element 216. The sample value held by the register 214 is applied to a second input terminal of the subtracter 218. The subtracter 218 subtracts the sample value held by the register 214 from that held by the register 210 and applies the result to sample dividing circuitry 240. The sample values provided by the circuitry 200 represents the difference between the amplitude of the Q signal before and after the leading edge of vertical sync (i.e. B'-A' in FIG. 4E). The circuitry 230 similarly provides sample values representing the difference between the amplitude of the I signal before and after the leading edge of vertical sync (i.e. D'-C' in FIG. 4D) to a second input port of the sample dividing circuitry 240. The difference between the Q sample values is divided by the difference between the I sample values by the sample dividing circuitry 240. The signal, PE, provided by the dividing circuitry 240, which corresponds to the output signal of the demodulation phase error detector 30, is substantially equal to the tangent of the phase angle separating the extracted IF carrier and the direct IF carrier. This signal is applied to the ROM 32 which develops the correction signals $C_I$ and $C_Q$ that are applied to the complex multiplier 28.

Basic to understanding the operation of the demodulation phase error detector 30 are the equations describing the synchronous demodulation of the in-phase, I, and quadrature phase, Q, components of a vestigial sideband modulated signal using a regenerated carrier which differs in phase from the carrier of the modulated signal by an angle $\theta$. These well known equations may be expressed as:

$$I = i \cos \theta - q \sin \theta \quad (1)$$

$$Q = i \sin \theta + q \cos \theta \quad (2)$$

where i and q are the baseband in-phase and quadrature phase components which would be obtained if the regenerated carrier had the same phase as the carrier of the desired signal. In the context of the present invention, the desired signal is the direct signal component of the IF television signal and $\theta$ is the phase angle by which the IF carrier of the combined direct and ghost television signal differs from the IF carrier of the direct signal. Using equation (2) the values of A' and B' of FIG. 4E may be expressed as functions of the values A and B of FIG. 4B and the values C and D of FIG. 4A as:

$$A' = C \sin \theta + A \cos \theta \quad (3)$$

$$B' = D \sin \theta + B \cos \theta. \quad (4)$$

Similarly, using equation (1), the value C' and D' of FIG. 4D may be expressed as:

$$C' = C \cos \theta - A \sin \theta \quad (5)$$

$$D' = D \cos \theta - B \sin \theta. \quad (6)$$

As set forth above, the function realized by the circuitry shown in FIG. 2 is described by the equation:

$$\text{Tan } \theta = (B' - A')/(D' - C'). \quad (7)$$

This identity may be proved by substituting the equations (3) through (6) into the equation (7) and combining like terms to yield:

$$\text{Tan } \theta = ((D-C) \sin \theta + (B-A) \cos \theta)/((D-C) \cos \theta - (B-A) \sin \theta). \quad (8)$$

From FIG. 4B it is noted that A=B. This identity is substituted into the equation (8), yielding:

$$\text{Tan } \theta = (D-C) \sin \theta /(D-C) \cos \theta. \quad (9)$$

The factors (D−C) cancel, so the equation (9) becomes the well known identity:

$$\text{Tan } \theta = \sin \theta / \cos \theta. \quad (10)$$

The signal PE provided by the demodulation phase error detector 30 is applied to the address input port of ROM 32 which is programmed to provide two transfer functions, $TC_I$ and $TC_Q$. The transfer function $TC_I$ is equal to the cosine of the arctangent of the applied address code and $TC_Q$ is equal to minus the sine of the arctangent of the applied address code. Since the address codes are equal to the tangent of $\theta$, the transfer functions $TC_I$ and $TC_Q$ provide the correction signals $C_I$ and $C_Q$:

$$C_I = \cos \theta \quad (11)$$

$$C_Q = -\sin \theta. \quad (12)$$

These correction signals and the synchronously demodulated signals I and Q maybe considered to be two complex signals each having real and imaginary parts corresponding to the in-phase and quadrature phase signals respectively. The complex multiplier 28 combines these two complex signals to develop a phase corrected complex signal having real and imaginary parts, I' and Q' respectively.

Figure 3:
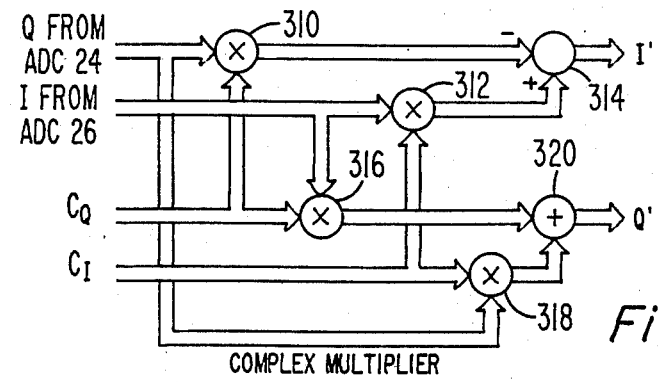
FIG. 3 is a block diagram of a complex multiplier which may be used in the portion of the television receiver shown in FIG. 1.

FIG. 3 is a block diagram showing exemplary circuitry for the complex multiplier 20. A conventional digital multiplier 310 forms the product of the signals Q and $C_Q$ and applies this product to one input port of a subtracter 314. The product of the signals I and $C_I$ is formed by a multiplier 312 which applies the result to another input port of the subtractor 314. Subtractor 314 subtracts the product of the signals Q and $C_Q$ from the product of I and $C_I$ and to develop the corrected in-phase signal I'. Multipliers 316 and 218 form the products of I and $C_Q$ and of Q and $C_I$ respectively. The output signals of the multipliers 316 and 318 are applied to an adder 320 which sums the signals to develop the corrected quadrature signal Q'.

Using the equations 1, 2, 11, and 12, the signals I' and Q' provided by the complex multiplier 28 may be described by the equations:

$$I' = (i \cos \theta - q \sin \theta)\cos \theta - (i \sin \theta + q \cos \theta)(-\sin \theta) \quad (13)$$

and $$Q' = (i \sin \theta + q \cos \theta)\cos \theta + (i \cos \theta - q \sin \theta)(-\sin \theta) \quad (14)$$

Expanding the equations (13) and (14) yields:

$$I' = i \cos \theta \cos \theta - q \sin \theta \cos \theta + i \sin \theta \sin \theta + q \cos \theta \sin \theta \quad (15)$$

$$I' = i (\cos^2 \theta + \sin^2 \theta) \quad (16)$$

$$I' = i \quad (17)$$

$$Q' = i \sin \theta \cos \theta + q \cos \theta \cos \theta - i \cos \theta \sin \theta + q \sin \theta \sin \theta \quad (18)$$

$$Q' = q (\cos^2 \theta + \sin^2 \theta) \quad (19)$$

$$Q' = q \quad (20)$$

Consequently, the direct signal components of the signals I' and Q' produced by the complex multiplier 28 are substantially free of any demodulation phase error distortion components.

What is claimed is:

1. In a system for processing radio frequency television signals having a direct signal component including a direct carrier signal and a delayed direct signal component including a delayed direct carrier signal and including means for synchronously demodulating said radio frequency television signals using reference signals that are respectively in-phase with and quadrature phase related to the vector sum of said direct carrier signal and said delayed direct carrier signal to obtain respective first and second baseband signals each having direct and delayed direct signal components, wherein the direct signal components of said first and second baseband signals may include reciprocal crosstalk distortion components, circuitry for reducing the magnitude of the crosstalk distortion components of said first baseband signal comprising:

means responsive to said first and second baseband signals for generating a phase difference signal being proportional to the difference in phase between said direct carrier signal and the vector sum of said direct carrier signal and said delayed direct carrier signal;

means responsive to said phase difference signal for generating a phase correction signal; and means coupled to said phase correction signal generating means for combining said phase correction signal and said first baseband signal to generate a modified first baseband signal having substantially reduced crosstalk distortion components.

2. The circuitry set forth in claim 1 wherein:

said radio frequency television signals include a synchronizing signal component having periodic transitions; and said phase difference signal generating means includes means responsive to said first and second baseband signals for generating said phase differenc signal being proportional to the ratio of the difference between the values of said second baseband signal at times immediately before and immediately after one of said periodic transitions and the difference between the values of said first baseband signal at times immediately before and immediately after one of said periodic transitions.

3. The circuitry set forth in claim 1 wherein:

said phase correction signal generating means includes means responsive to said phase difference signal for generating said phase correction signal being proportional to the cosine of the difference in phase between said direct carrier signal and the vector sum of said direct carrier signal and said delayed direct carrier signal; and said combining means includes means for multiplying said first baseband signal by said phase correction signal.

4. In a system including a source of radio frequency television signals having a direct signal component including a direct carrier signal and a delayed direct signal component including a delayed direct carrier signal, apparatus comprising:

first and second synchronous detection means coupled to said source and responsive to respective first and second reference signals that are respectively in-phase with the quadrature phase related to the vector sum in said direct and delayed direct carrier signals for generating first and second baseband signals each having direct and delayed direct signal components, wherein the direct signal components of said first and second baseband signals may include reciprocal crosstalk distortion components;

means responsive to said first and second baseband signals for generating a phase difference signal being proportional to the difference in phase between said direct carrier signal and the vector sum of said direct carrier signal and said delayed direct carrier signal;

means responsive to said phase difference signal for generating first and second phase correction signals; and means coupled to said phase correction signal generating means for combining said first and second phase correction signals and said first and second baseband signals to generate modified first and second baseband signals having substantially reduced crosstalk distortion components.

5. The apparatus set forth in claim 4 wherein:

said radio frequency television signals include a synchronizing pulse signal component having periodic transitions; and said phase difference signal generating means includes means responsive to said first and second baseband signals for generating said phase difference signal being proportional to the ratio of the difference between the values of said second baseband signal at times immediately before and immediately after one of said periodic transitions and the difference between the values of said first baseband signal at times immediately before and immediately after one of said periodic transitions.

6. The apparatus set forth in claim 5 wherein:

said phase difference signal is proportional to the tangent of the difference in phase between said direct carrier signal and the vector sum of said direct carrier signal and said delayed direct carrier signal;

said phase correction signal generating means includes means responsive to said phase difference signal for generating said first and second phase correction signals being proportional, respectively, to the cosine and sine of the phase difference represented by said phase difference signal; and said combining means includes a complex multiplier having first and second real and imaginary input ports and real and imaginary output ports, said first real and imaginary input ports being coupled to receive said first and second baseband signals respectively said second real and imaginary input ports being coupled to receive said first and second phase correction signals respectively, and said real and imaginary output ports providing respectively, said modified first and second baseband signals having substantially reduced crosstalk distortion components.

* * * * *